(12) United States Patent
Mardilovich et al.

(10) Patent No.: US 7,445,814 B2
(45) Date of Patent: Nov. 4, 2008

(54) METHODS OF MAKING POROUS CERMET AND CERAMIC FILMS

(75) Inventors: Peter Mardilovich, Corvallis, OR (US); Gregory S. Herman, Albany, OR (US); James O'Neil, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 744 days.

(21) Appl. No.: 10/691,199

(22) Filed: Oct. 22, 2003

(65) Prior Publication Data

US 2005/0095479 A1 May 5, 2005

(51) Int. Cl.
*C23C 10/00* (2006.01)

(52) U.S. Cl. ............ 427/248.1; 427/249.1; 427/255.11; 427/376.3; 204/192.1

(58) Field of Classification Search ............... 427/248.1; 204/192.1
See application file for complete search history.

(56) References Cited

U.S. PATENT DOCUMENTS

| | | | | |
|---|---|---|---|---|
| 4,299,865 A | * | 11/1981 | Clingman et al. ............ 427/243 |
| 4,590,095 A | * | 5/1986 | Park ............................ 427/560 |
| 4,601,795 A | * | 7/1986 | Smith et al. .................. 205/109 |
| 4,654,228 A | | 3/1987 | Komiyama |
| 4,770,701 A | * | 9/1988 | Henderson et al. ............ 75/232 |
| 4,781,734 A | * | 11/1988 | Behr et al. ..................... 95/56 |
| 5,091,222 A | | 2/1992 | Nishio et al. |
| 5,120,707 A | * | 6/1992 | Maxfield et al. ............ 505/325 |
| 5,162,295 A | * | 11/1992 | Behi et al. ................... 505/472 |
| 5,858,523 A | | 1/1999 | Kawai et al. |
| 5,874,175 A | * | 2/1999 | Li .............................. 428/457 |
| 6,027,796 A | | 2/2000 | Kondoh et al. |
| 6,253,441 B1 | * | 7/2001 | Wheat et al. ................ 29/527.2 |
| 6,284,314 B1 | | 9/2001 | Kato et al. |
| 6,503,560 B2 | * | 1/2003 | Toshima et al. ............. 427/216 |
| 6,528,123 B1 | * | 3/2003 | Cadden et al. ............... 427/404 |
| 6,592,980 B1 | | 7/2003 | MacDougall et al. |
| 7,256,146 B2 | * | 8/2007 | Cohen et al. ................. 438/790 |
| 2003/0096155 A1 | | 5/2003 | Hong et al. |
| 2003/0138658 A1 | * | 7/2003 | Taylor et al. ................. 428/632 |
| 2003/0152797 A1 | * | 8/2003 | Darolia et al. ............... 428/633 |
| 2004/0076868 A1 | * | 4/2004 | Mardilovich et al. .......... 429/34 |
| 2006/0051599 A1 | * | 3/2006 | Jahedi et al. ................. 428/469 |
| 2006/0051661 A1 | * | 3/2006 | Meacham .................... 429/129 |

OTHER PUBLICATIONS

Hackh's Chemical Dictionary, 4th edition, edited by Julius Grant, 1969, p. 462.*

* cited by examiner

*Primary Examiner*—Bret Chen

(57) ABSTRACT

A method for making a porous film includes the steps of forming a cermet film and/or a ceramic film by depositing or co-depositing suitable materials on a substrate, and causing metal in the material(s) to reduce and/or to diffuse to the cermet film surface and/or the ceramic film surface to render the porous film.

38 Claims, 3 Drawing Sheets

METHODS OF MAKING POROUS CERMET AND CERAMIC FILMS

BACKGROUND OF THE INVENTION

The present invention relates generally to films, and more particularly to the fabrication of porous films. The porous films may be used in a variety of applications ranging, for example, from sensors, to catalysts, to porous media, to fuel cells.

Fuel cells use an electrochemical energy conversion of fuel (including but not limited to hydrogen, propane, methane, carbon monoxide, and the like) and oxidant(s) into electricity and heat. It is anticipated that fuel cells may be able to replace primary and secondary batteries as a portable power supply. In fuel cells, the fuel (usually containing a source of hydrogen) is oxidized typically with a source of oxygen to produce (primarily) water and carbon dioxide. The oxidation reaction at the anode, which liberates electrons, in combination with the reduction reaction at the cathode, which consumes electrons, results in a useful electrical voltage and current through the load.

Fuel cells provide a direct current that may be used to power motors, lights, electrical appliances, etc. A solid oxide fuel cell (SOFC) is one type of fuel cell that may be useful in portable or non-portable applications. Unfortunately, the material properties, which are generally desirable in order to obtain high performing fuel cell devices, also make fabrication of those fuel cell devices a significant challenge.

A thin film approach for the fabrication of SOFCs is relatively new and has many challenges. There are many different techniques for deposition of thin films. Some of them, such as physical vapor deposition (PVD), chemical vapor deposition (CVD), atomic layer deposition (ALD), etc., have many advantages, but deposition of porous films (with techniques such as these) for use as, for example, SOFC electrodes, may be a significant challenge. This may be due in part to the fact that these techniques are normally used for deposition of dense films.

Porous films may be deposited (for example, by PVD) by increasing the pressure in a deposition chamber, decreasing the substrate temperature, or increasing the source to substrate distance. However, these techniques generally do not allow deposition of highly porous films. The porosity achievable by these deposition techniques is generally below about 5%. Another technique for depositing a porous film with one-dimensional through channels requires the deposition of two components. The through channels are created when one of the components is selectively removed by etching.

SUMMARY OF THE INVENTION

The present invention substantially solves the drawbacks enumerated above by providing a method for making a porous film. The method includes the steps of forming a cermet film and/or a ceramic film by depositing or co-depositing suitable materials on a substrate, and causing metal in the material(s) to reduce and/or to diffuse to the cermet film surface and/or the ceramic film surface to render the porous film.

BRIEF DESCRIPTION OF THE DRAWINGS

Objects, features and advantages of the present invention will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION OF THE EMBODIMENTS

Embodiments of the present invention describe novel methods for fabricating porous films and composite films. It is to be understood that the present invention is not limited to its application, and that the porous films/porous composite films may be used in a variety of applications ranging, for example, from sensors, to catalysts, to porous media, to fuel cells, to batteries, among others.

A porous thin film according to embodiment(s) of the present invention may be useful as a fuel cell electrode. Catalytic efficiency is advantageously substantially enhanced at the porous thin film.

As will be described further hereinbelow, in embodiment(s) of the present invention, a porous thin film electrode (e.g. an anode or a cathode) generally advantageously exhibits improved diffusion rates of the gases to the electrode-electrolyte interface, higher surface area resulting in higher catalytic efficiency of the electrodes, higher mass transport, and greater three-phase boundary length between the electrode and the electrolyte. Further, porous films are better able to withstand thermo-cycling. Yet further, higher mismatches of coefficients of thermal expansion are advantageously allowed.

Figure 1:
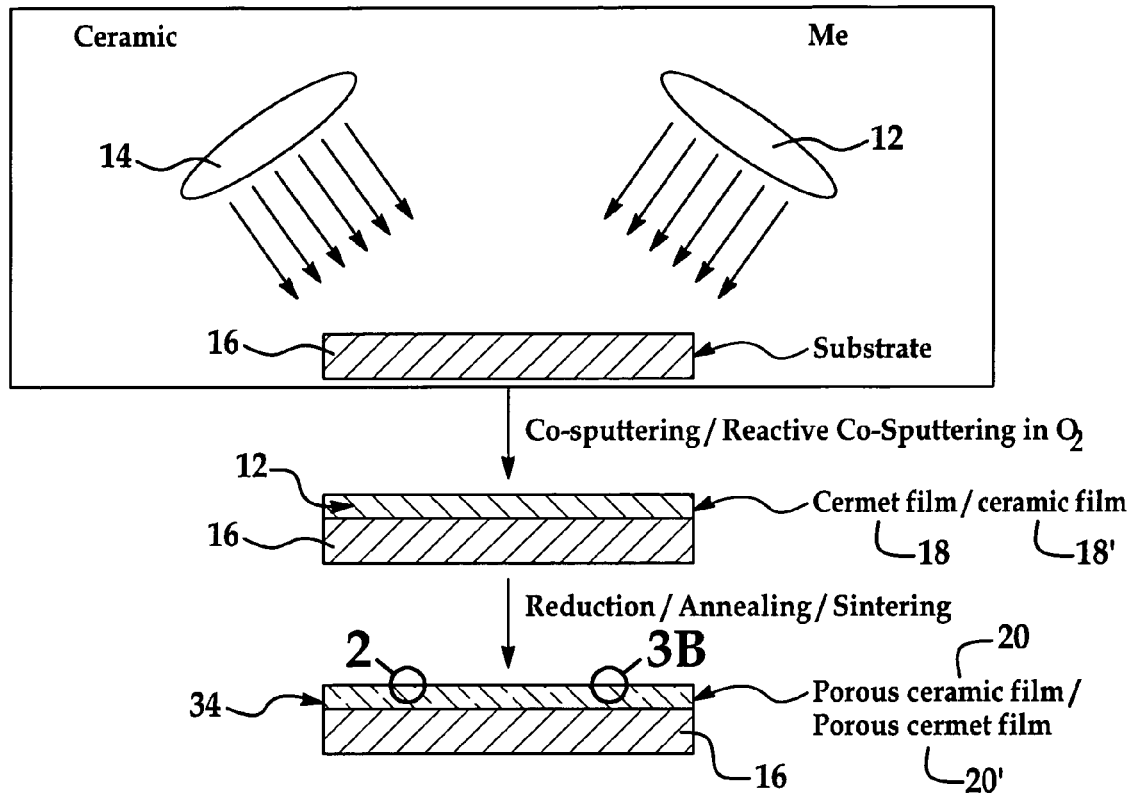
FIG. 1 is a schematic view of an embodiment of the method of the present invention.

Referring now to FIG. 1, the present inventors have advantageously discovered that a thin film 34 may be formed with "throughout porosity" (i.e. having continuous pores throughout substantially the entire thickness of the thin film) by forming a dense film 18, 18' with a mobile metal therein (the metal 12 either having been highly mobile initially or having been rendered more mobile), and by causing the mobile metal to diffuse to the surface of the dense film 18,18' and/or to reduce within the dense film 18,18', thereby rendering a porous film 34.

An embodiment of a method for making a porous film 34 of the present invention includes the step of co-depositing a metal Me, 12 and a ceramic 14 on a substrate 16. In embodiments of the present invention, the co-deposition forms either a cermet film 18 or a ceramic film 18'.

It is to be understood that any suitable metal/metal oxide 12 that will not chemically react with the chosen ceramic 14 may be used. Some non-limitative examples of suitable metals 12 include gold, nickel, platinum, copper, palladium, silver, rhodium, and/or ruthenium, alloys thereof, and/or mixtures thereof. Some further non-limitative examples of suitable metals 12 include nickel-copper alloys, palladium-gold alloys, silver-gold alloys and platinum-ruthenium alloys. Oxides of any of the above-listed metals/alloys may also be used.

It is to be understood that any suitable concentration of the metal 12 in the cermet film 18 or ceramic film 18' may be used. In an embodiment, varying the metal 12 concentration may control the porosity of the formed porous film 34. If substantially all the metal 12 diffuses to the surface, the concentration of the metal 12 in the cermet film 18 or ceramic film 18' in volume % would be approximately equal to the subsequent porosity of the film 34. If a portion of the metal 12 diffuses, the porosity will be lower. For example, if the cermet film 18 or ceramic film 18' contains about 50% metal by volume (which is about 50% of the thickness) and about half of the metal 12 diffuses, the film 34 would have a porosity of about 25%. In embodiment(s) of the present invention wherein substantially most or all of the metal 12 diffuses out, the porosity of the porous film 34 may range between about 5% and about 50%; alternately, the porosity may range between about 10% and about 25%. In embodiment(s) of the present invention wherein the metal 12 reduces within the porous film 34, the porosity of the porous film 34 may range between about 1% and about 30%; alternately, the porosity may range between about 5% and about 15%. When both reduction and diffusion occurs, the porosity of the resulting cermet will generally be equivalent to the volume of the material which is removed.

Further, it is to be understood that any suitable ceramic and/or cermet 14 may be chosen. In an embodiment, the ceramic 14 is samarium doped ceria and/or samarium strontium cobalt oxide. In alternate embodiment(s), suitable ceramics and/or cermets 14 include materials suitable for use as anode materials; which include but are not limited to nickel oxides, platinum oxides, Ni—YSZ (nickel-yttria stabilized zirconia), Cu—YSZ (copper-yttria stabilized zirconia), Ni—SDC (nickel-samaria doped ceria), Ni-GDC (nickel-gadolinium doped ceria), Cu—SDC (copper-samaria doped ceria), and Cu-GDC (copper-gadolinium doped ceria). Further, in alternate embodiment(s), suitable ceramics and/or cermets 14 include materials suitable for use as cathode materials; which include but are not limited to silver oxides, platinum oxides, samarium strontium cobalt oxide (SSCO, $Sm_xSr_yCoO_{3-\delta}$), barium lanthanum cobalt oxide (BLCO, $Ba_xLa_yCoO_{3-\delta}$), gadolinium strontium cobalt oxide (GSCO, $Gd_xSr_yCoO_{3-\delta}$), lanthanum strontium manganite ($La_xSr_yMnO_{3-\delta}$) and lanthanum strontium cobalt ferrite ($La_wSr_xCo_yFe_zO_{3-\delta}$) and/or mixtures thereof.

Yet further, it is to be understood that any suitable substrate 16 may be chosen. In an embodiment, the substrate 16 is single crystal silicon, polycrystalline silicon, silica on silicon, thermal oxide on silicon (TOX/Si), alumina, sapphire, ceramic, and/or mixtures thereof. If the porous film 34 is to be used as an SOFC electrode, substrate 16 may be any suitable electrolyte material, including but not limited to cubic fluorites, doped cubic fluorites, proton-exchange ceramics, yttria-stabilized zirconia (YSZ), samarium doped-ceria (SDC, $Ce_xSm_yO_{2-\delta}$), gadolinium doped-ceria (GDC, $Ce_xGd_yO_{2-\delta}$), $La_aSr_bGa_cMg_dO_{3-\delta}$ and mixtures thereof.

It is to be understood that any suitable deposition technique may be used to co-deposit the metal 12 and the ceramic 14 onto the substrate 16. In an embodiment, thin film deposition technique(s) may be used. Some non-limitative examples of thin film deposition techniques include physical vapor deposition (PVD) (PVD includes, for example, co-sputtering, reactive sputtering, reactive co-sputtering, evaporation, pulsed laser deposition, ion beam methods), chemical vapor deposition (CVD), atomic layer deposition (ALD), angle deposition (for example glancing angle deposition (GLAD)), and/or combinations thereof.

Further, it is to be understood that the cermet film 18/ceramic film 18' may have any suitable thickness. In an embodiment, the thickness ranges between about 0.02 μm and about 5 μm. In a further embodiment, the thickness ranges between about 0.1 μm and about 2 μm. It is also to be understood that the thickness of the porous film 20, 20' may have approximately the same thickness as the deposited film.

Figure 2:
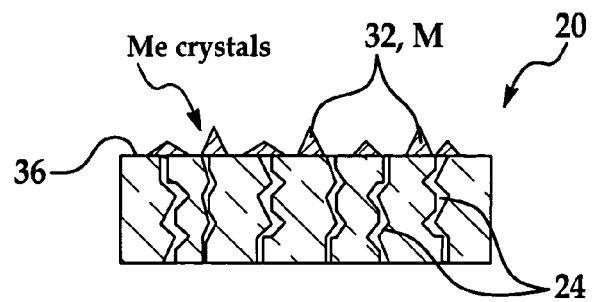
FIG. 2 is an enlarged cross-sectional view of the area shown at "2" in FIG. 1, showing pores extending substantially throughout the film, and showing metal crystals agglomerated on the film surface.
Figure 3A:
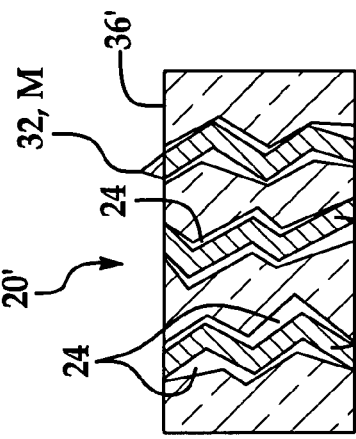
FIG. 3A is an enlarged cross-sectional view of an alternate embodiment of the present invention, showing a co-deposited ceramic film.
Figure 3B:
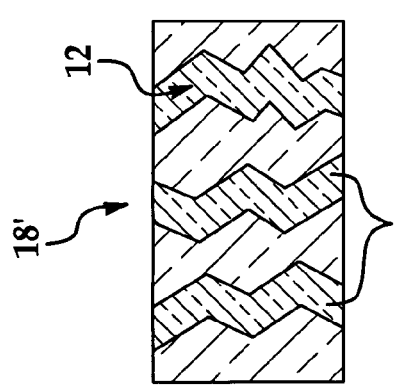
FIG. 3B is an enlarged cross-sectional view of the area shown at "3B" in FIG. 1, showing a porous cermet film.

A mobile metal is designated schematically as M (in FIGS. 2 and 3B). In general, all metals are mobile. Their mobility is generally proportional to the temperature, i.e. the higher the temperature, the higher the mobility. The effect of this mobility is advantageously utilized in embodiments of the methods for forming porous films of the present invention. The Tamman temperature, $T_{Tamman}$, is the temperature at about which the metals become significantly more mobile. $T_{Tamman}$ is defined as 0.5 of the metal melting temperature in K. For gold, which has a melting temperature of 1064° C., $T_{Tamman}$ would be: (1064+273)/2−273=~396° C. So, at temperatures above about 400° C., a significant mobility of gold in thin films may be expected. For illustrative and non-limitative purposes, here is the calculated Tamman temperature of a few metals:

|    | Melting T (° C.) | Tamman T (° C.) |
| --- | --- | --- |
| Cu | 1083 | 405 |
| Ni | 1453 | 590 |
| Au | 1064 | 396 |
| Ag | 962 | 344 |
| Pd | 1552 | 639 |
| Pt | 1772 | 749 |

In an embodiment of the method of the present invention, the metal 12 is rendered mobile (as opposed to being mobile initially). In an alternate embodiment, the metal 12 is rendered mobile by reduction. Reduction may be used if the metal 12 was oxidized, or partially oxidized. The reduction will transfer the metal oxide, which has very low mobility, into a metal 12 that has much higher mobility.

In an embodiment of the present invention, the step of co-depositing the metal 12 and the ceramic 14 may take place in the presence of oxygen to oxidize the metal 12. In an embodiment, the oxidation takes place in the presence of 5% oxygen. It is to be understood that the percentage of oxygen may be any suitable percentage. In an embodiment, the percentage of oxygen ranges between about 0% (if the metal 12 is already oxidized) and about 50%. In an alternate embodiment, the percentage of oxygen ranges between about 5% and about 10%. The percentage of oxygen may be varied depending upon the metal 12 being co-deposited. In general, RF sputtering of oxides in a vacuum system results in partial reduction of the oxide. Further, argon in the vacuum system during deposition may behave as a reducing agent. To prevent this reduction, deposition in the presence of a controlled percentage of oxygen is typically performed.

According to an embodiment of the present invention, the method further includes the step of causing the mobile metal M to diffuse to the surface of the cermet film 18 or the ceramic film 18'.

In an embodiment, subjecting the cermet film 18 and/or the ceramic film 18' to annealing or sintering causes the mobile metal M (which is initially a highly mobile metal) to diffuse to, and/or agglomerate on, the surface of the cermet film 18 or the ceramic film 18', thereby rendering a porous ceramic film 20 or a porous cermet film 20'. Some non-limiting examples of pore sizes formed in this embodiment of the method of the present invention range between about 1 nm and about 100 nm or more; alternately the pore sizes may range between about 10 nm and about 60 nm.

In an alternate embodiment, subjecting the cermet film 18 and/or the ceramic film 18' to annealing or sintering may form the porous ceramic film 20 or the porous cermet film 20' substantially without diffusion of the mobile metal M. In this embodiment, the porosity of the film 20, 20' is lower than that of the embodiment described immediately hereinabove. Some non-limiting examples of pore sizes formed in this embodiment of the method of the present invention range between about 0.5 nm and about 10 nm or more; alternately the pore sizes may range between about 1 nm and about 5 nm.

Sintering may be defined as firing or heating at or below the melting point of the material for the purpose of increasing strength by bonding the particles together. Annealing may be defined as a heat treatment wherein the microstructure of a material is altered, causing changes in its properties such as strength and hardness. Typically, this results in softening of the metal through removal of crystal defects and the internal stresses which they cause.

It is to be understood that annealing and/or sintering may take place under any suitable conditions. In an embodiment, annealing/sintering takes place at a temperature ranging between about 750° C. and about 1000° C. In an alternate embodiment, annealing/sintering takes place at a temperature ranging between about 750° C. and about 850° C. Yet in a further embodiment, annealing/sintering takes place at about 800° C. It is to be understood that the annealing/sintering temperature chosen may be high enough to sinter the oxide portion of the cermet/ceramic film 18, 18' (often the oxide may be amorphous as deposited, and has low oxygen mobility). The temperature for annealing/sintering may be about at least as high as the operating temperature of the final porous film 34. The annealing/sintering temperature also may be high enough for at least some metal diffusion to the film surface 36, 36'. Further, the annealing/sintering temperature chosen generally should not exceed the temperature of chemical interaction between substrate 16 and the components 12,14 of the cermet/ceramic film 18, 18'.

In an embodiment, sintering may cause the metal 12 to reduce and form a porous cermet film 20'. Additionally, sintering may also cause some of the metal 12 to agglomerate on the cermet film 20' surface.

Now referring to FIG. 2, an embodiment of the porous ceramic film 20 of the present invention has pores 24 therethrough and metal crystals 32 agglomerated on the surface 36 of the porous ceramic film 20. The metal crystals 32 are formed after the mobile metal M diffuses to the surface of the cermet film 18 (film 18 is shown in FIG. 1), leaving pores 24 in the porous ceramic film 20 in the areas which had been occupied by mobile metal M. The pores 24 extend substantially continuously throughout the thickness of the porous ceramic film 20. Pores 24 may advantageously result in a greater number of catalytic sites and higher catalytic efficiency, thermal stress resistance, and higher mass transport, among other advantages.

If porous ceramic film 20 is to be used as an electrode in a fuel cell, a current collector (not shown) may advantageously be placed in contact with metal crystals 32 which may help collect electrical current more efficiently. It is to be understood that the current collector may be formed from any suitable material, and may be deposited on and/or placed in contact with metal crystals 32 by any suitable method. As non-limiting examples, the current collector may be formed from at least one of gold, silver, stainless steel, nickel alloys, electron conducting ceramics, and/or mixtures thereof. The current collector may be in the form of, for example, a finger-like material, a net, or the like. As a further example, the current collector may be deposited by screen printing, inkjetting, and/or other deposition methods.

Now referring to FIGS. 3A and 3B, an embodiment of the method of the present invention may further include the step of subjecting the ceramic film 18' or the cermet film 18 to reduction to form the porous cermet film 20' or the porous ceramic film 20. It is to be understood that any suitable reduction conditions may be used. In an embodiment, reduction takes place in the presence of hydrogen. In a further embodiment, the reduction temperature ranges between about 400° C. and about 800° C. In an alternate embodiment, the reduction temperature ranges between about 500° C. and about 600° C. It is to be understood that the range of reduction temperatures may depend on the nature of the metal 12, the background atmosphere, the size of the particles, etc. For example, in the case of nickel compounds, the reduction may start at about 400° C.

Referring particularly now to FIG. 3A, in an embodiment of the present invention, the ceramic film 18' has metal oxide 22 therethrough. The ceramic film 18' is annealed, which may cause some of the mobile metal M to diffuse out and agglomerate on the surface of the ceramic film 18' while leaving some metal oxide 22 remaining in the ceramic film 18' (the metal crystals 32 formed by this diffusion are represented at 32 in FIG. 3B on the surface 36' of porous cermet film 20'). In an embodiment of the present invention, between about 0% and about 50% of the mobile metal M may diffuse out and agglomerate on the surface of the ceramic film 18'.

Referring now to FIG. 3B, subjecting the ceramic film 18' containing metal oxide 22 therein to reduction forms the porous cermet film 20' with pores 24 and metal 12 throughout.

In a non-limiting example, nickel and samarium doped ceria are co-deposited on a YSZ or SDC substrate in the presence of about 5% oxygen to form a ceramic film 18' containing nickel oxide. The ceramic film 18' is subjected to annealing, followed by reduction in the presence of hydrogen to form the porous cermet film 20' containing pores 24 and nickel throughout.

In an alternate embodiment, subjecting the ceramic film 18' to sintering, which causes some of the metal oxide 22 to reduce, renders the porous cermet film 20' with pores 24 and metal 12 throughout.

In a non-limiting example, platinum and samarium doped ceria are co-deposited on a YSZ, SDC, or TOX/Si substrate in the presence of oxygen to form a ceramic film 18' containing platinum oxide. The ceramic film 18' containing platinum oxide is subjected to sintering, which causes some of the platinum oxide to reduce to render a porous cermet film 20', while the rest of the platinum agglomerates on the surface of the porous cermet film 20' leaving pores 24 throughout. Other metal oxides which may be reduced at high temperature in the presence of oxygen include oxides of silver and gold, as well as oxides of other noble metals such as rhodium, ruthenium and palladium.

Figure 4:
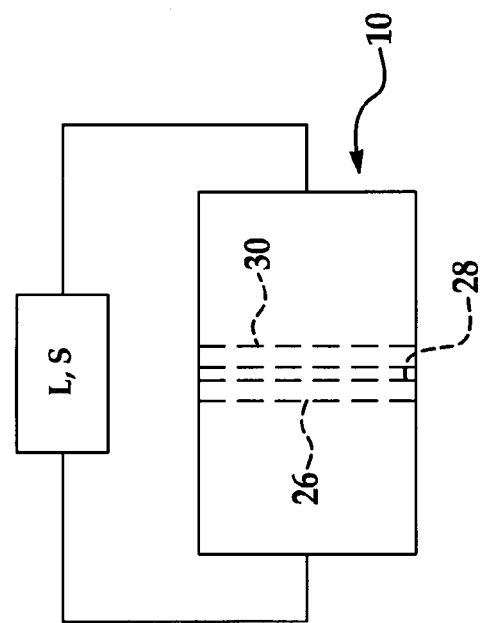
FIG. 4 is a schematic view of an embodiment of the fuel cell of the present invention.

Referring now to FIG. 4, an embodiment of a fuel cell 10 of the present invention includes an anode 26, an electrolyte 28, and a cathode 30. It is to be understood that the anode 26 and/or the cathode 30 may be a porous film 34 according to embodiment(s) of the present invention.

FIG. 4 is a simplified schematic diagram of a dual chamber fuel cell 10. It is to be understood that fuel cell 10 may also be a single chamber fuel cell.

It is to be understood that the fuel cell 10 may be one of solid oxide fuel cells and/or proton conducting ceramic fuel cells. In an embodiment of the present invention, fuel cell 10 is a solid oxide fuel cell.

In the fuel cell 10 embodiments of the present invention, oxidants are carried to the cathode 30, and reactants are carried to the anode 26. In an embodiment, the reactants are fuels, and the oxidants are one of oxygen, air, and mixtures thereof. It is to be understood that any suitable fuel/reactant may be used with the fuel cell 10 of the present invention. In an embodiment, the fuel/reactant is selected from at least one of hydrogen, methane, ethane, propane, butane, pentane, methanol, ethanol, higher straight chain or mixed hydrocarbons, for example, natural gas or gasoline (low sulfur hydrocarbons may be desirable, e.g. low sulfur gasoline, low sulfur kerosene, low sulfur diesel), and mixtures thereof. In an alternate embodiment, the fuel/reactant is selected from the group consisting of butane, propane, methane, pentane, and mixtures thereof. Suitable fuels may be chosen for their suitability for internal direct reformation, suitable vapor pressure within the operating temperature range of interest, and like parameters.

It is to be understood that if fuel cell 10 is a single chamber fuel cell, a gaseous mixture of reactant and oxidant may be directed toward the anode 26 and/or the cathode 30.

An embodiment of a method of using fuel cell 10 includes the step of operatively connecting the fuel cell 10 to electrical load L and/or to electrical storage device S. The electrical load L may include many devices, including, but not limited to any or all of computers, portable electronic appliances (e.g. portable digital assistants (PDAs), portable power tools, etc.), and communication devices, portable or otherwise, both consumer and military. The electrical storage device S may include, as non-limitative examples, any or all of capacitors, batteries, and power conditioning devices. Some exemplary power conditioning devices include uninterruptible power supplies, DC/AC converters, DC voltage converters, voltage regulators, current limiters, etc.

It is also contemplated that the fuel cell 10 of the present invention may, in some instances, be suitable for use in the transportation industry, e.g. to power automobiles, and in the utilities industry, e.g. within power plants.

Figure 5A:
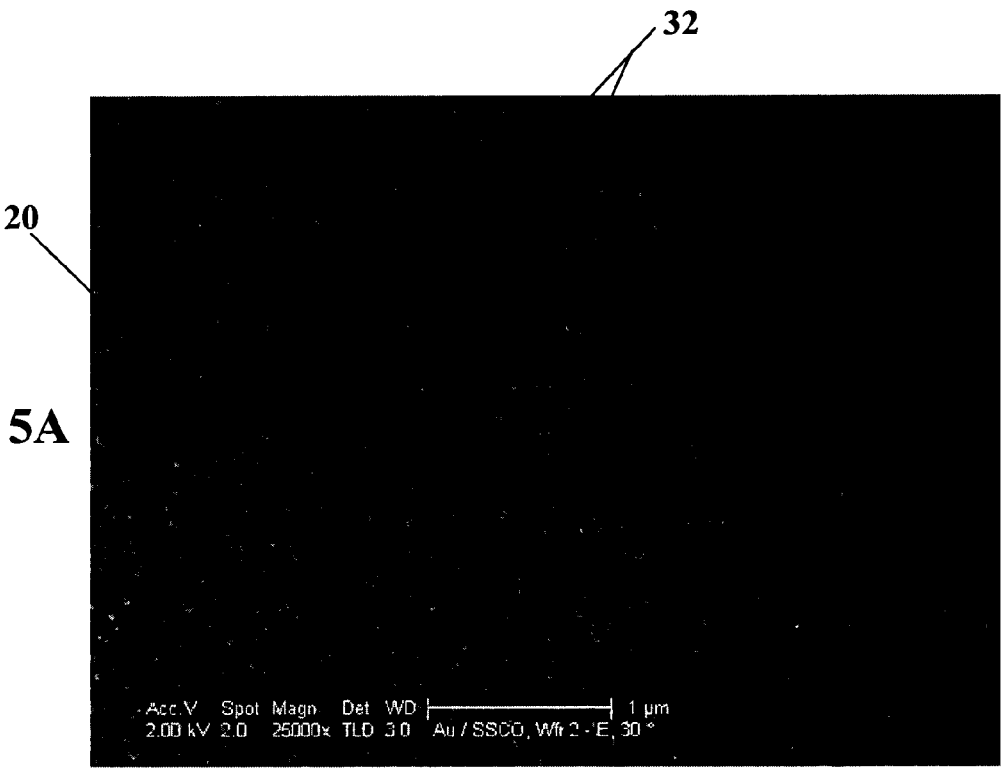
FIG. 5A is a scanning electron micrograph (SEM) at 25000× magnification showing a top view of a porous film formed by an embodiment of the present invention.
Figure 5B:
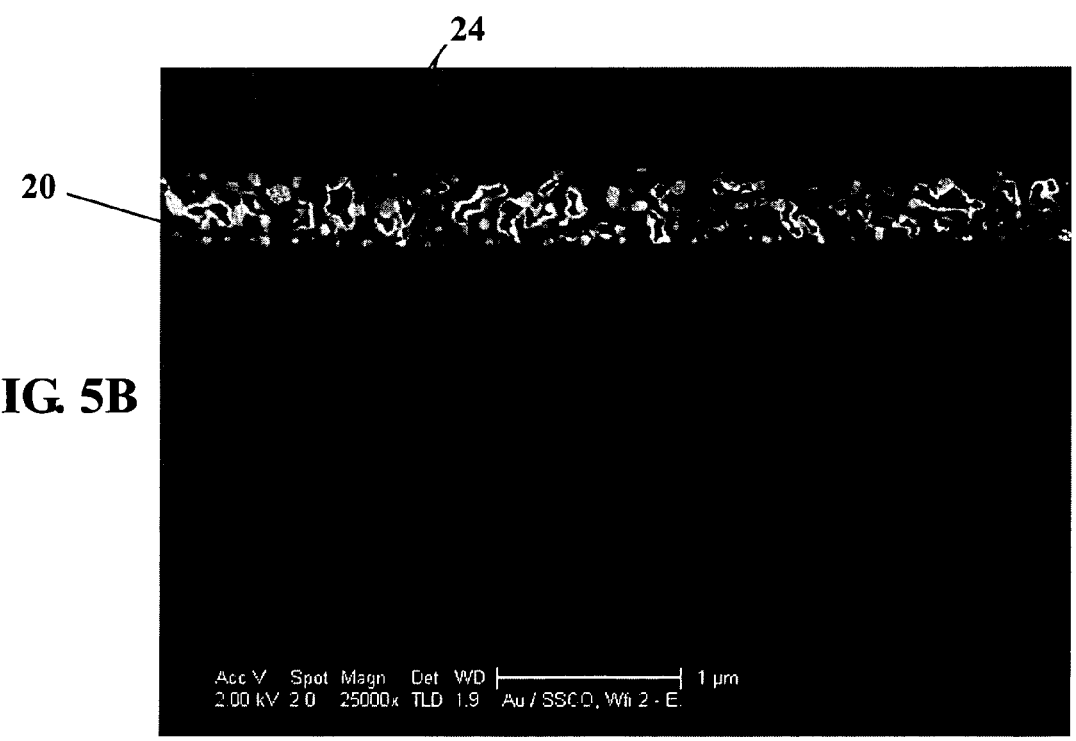
FIG. 5B is a SEM at 25000× magnification showing a cross-sectional view of the porous film of FIG. 5A.

In a non-limitative example, gold and samarium strontium cobalt oxide (SSCO) are co-deposited on a TOX/Si substrate to form a cermet film 18. The cermet film 18 is annealed at about 800° C. for about two hours, which causes the gold to diffuse to, and agglomerate on, the surface of the cermet film 18, thus forming the porous ceramic film 20. FIG. 5A is a SEM at 25000× magnification of a top view of the non-limitative example of the porous ceramic film 20, showing the gold agglomerated on the surface, designated as 32. FIG. 5B is a SEM at 25000× magnification of a cross-section of the porous ceramic film of FIG. 5A, showing the pores 24 throughout the ceramic film 20.

To further illustrate the present invention, the following examples are given. It is to be understood that these examples are provided for illustrative purposes and are not to be construed as limiting the scope of the present invention.

EXAMPLE 1

An oxide and a metal are co-deposited in the presence of oxygen where the metal is not oxidized to render a cermet film. The cermet film is subjected to high temperature annealing/sintering in the presence of oxygen to form a porous ceramic film.

EXAMPLE 2

An oxide and a metal are co-deposited in the presence of oxygen where the metal is not fully oxidized to render a cermet. The cermet film is subjected to high temperature annealing/sintering/reduction (gentle reduction is used to reduce one oxide) in the presence of a reducing atmosphere (e.g., $H_2$ or CO) to form a porous cermet film.

EXAMPLE 3

An oxide and a metal oxide are co-deposited in the presence of oxygen to fully oxidize the metal component to render a ceramic film. The ceramic film is subjected to high temperature annealing/sintering/reduction (gentle reduction is used to reduce one oxide) in the presence of a reducing atmosphere (e.g., $H_2$ or CO) to form a porous cermet film.

EXAMPLE 4

An oxide and a metal are co-deposited in the presence of oxygen to fully oxidize the metal component to render a ceramic film. The ceramic film is subjected to high temperature annealing/sintering/reduction (gentle reduction is used to reduce one oxide) in the presence of a reducing atmosphere (e.g., $H_2$ or CO) to form a porous cermet film.

EXAMPLE 5

A first metal and a second metal are co-deposited in the presence of oxygen where one metal is not fully oxidized to render a cermet film. The cermet film is subjected to high temperature annealing/sintering/reduction in the presence of a reducing atmosphere (e.g., $H_2$ or CO) or vacuum to form a porous cermet film.

EXAMPLE 6

A cermet material is deposited in the presence of oxygen to render a cermet film. The cermet film is subjected to high temperature annealing/sintering/reduction in the presence of a reducing atmosphere (e.g., $H_2$ or CO) to form a porous cermet film.

EXAMPLE 7

A binary ceramic material is deposited in the presence of oxygen to render a ceramic film. The ceramic film is subjected to high temperature annealing/sintering/reduction in the presence of a reducing atmosphere (e.g., $H_2$ or CO) to form a porous cermet film.

It is to be understood that the present invention is not intended to be limited to porous ceramic and cermet films used in fuel cells. For example, embodiments of the present invention may be used as sensors, membranes, porous media, current collectors, catalysts, and/or the like.

Embodiments of the present invention may provide many advantages, examples of which include, but are not limited to the following. Embodiments of the present invention may advantageously result in an improved method of making a porous film by providing a one step process and a simple method of controlling porosity. Further, embodiments of the present invention may advantageously result in improved performance of SOFC cathodes, due to the greater number of catalytically active sites. Without being bound to any theory, it is believed that, generally as a result of the greater number of catalytic sites on the walls of the pores, the electrodes have a higher catalytic efficiency. Further, the porous film increases the availability of the electrode-electrolyte interface to the air. It is believed that this availability to air may give a much higher diffusion rate of the gases to the interface. Yet further, embodiments of the present invention may also result in greater efficiency of the fuel cell due to a greater three-phase boundary length between the electrode and the electrolyte.

While several embodiments of the invention have been described in detail, it will be apparent to those skilled in the art that the disclosed embodiments may be modified. Therefore, the foregoing description is to be considered exemplary rather than limiting, and the true scope of the invention is defined in the following claims.

What is claimed is:

1. A method for making a porous film, comprising the step of:
causing a mobile metal to diffuse to at least one of a cermet film surface and a ceramic film surface, thereby rendering the porous film, the at least one of the cermet film and the ceramic film having been formed by co-depositing a metal and a ceramic on a substrate, wherein the co-deposited metal is the source of the mobile metal.

2. The method as defined in claim 1 wherein the co-depositing of the metal and the ceramic is accomplished by at least one of physical vapor deposition, chemical vapor deposition, atomic layer deposition, and angle deposition.

3. The method as defined in claim 1 wherein the metal is at least one of gold, nickel, platinum, copper, palladium, silver, rhodium, ruthenium, alloys thereof, and mixtures thereof.

4. The method as defined in claim 1 wherein the ceramic is at least one of nickel oxides, platinum oxides, Ni—YSZ, Cu—YSZ, Ni—SDC, Ni-GDC, Cu—SDC, Cu—GDC, silver oxides, samarium strontium cobalt oxide (SSCO, $Sm_xSr_yCoO_{3-\delta}$), barium lanthanum cobalt oxide (BLCO, $Ba_xLa_yCoO_{3-\delta}$), gadolinium strontium cobalt oxide (GSCO, $Gd_xSr_yCoO_{3-\delta}$), lanthanum strontium manganite ($La_xSr_yMnO_3$), lanthanum strontium cobalt ferrite ($La_wSr_xCo_yFe_zO_3$), and mixtures thereof.

5. The method as defined in claim 1 wherein the substrate is at least one of single crystal silicon, polycrystalline silicon, silica on silicon, thermal oxide on silicon, alumina, sapphire, ceramic, cubic fluorites, doped cubic fluorites, proton-exchange ceramics, yttria-stabilized zirconia (YSZ), samarium doped-ceria (SDC, $Ce_xSm_yO_{2-\delta}$), gadolinium doped-ceria (GDG, $Ce_xGd_yO_{2-\delta}$), $La_aSr_bGa_cMg_dO_{3-\delta}$, and mixtures thereof.

6. The method as defined in claim 1 wherein the causing step is accomplished by subjecting the at least one of the cermet film and the ceramic film to at least one of annealing and sintering.

7. The method as defined in claim 6 wherein the at least one of annealing and sintering occurs at a temperature between about 750° C. and about 1000° C.

8. The method as defined in claim 6 wherein the metal is gold and the ceramic is samarium strontium cobalt oxide, and wherein the causing step is accomplished by annealing.

9. The method as defined in claim 8 wherein annealing takes place at a temperature ranging between about 750° C. and about 850° C.

10. The method as defined in claim 9 wherein the gold agglomerates on the cermet film surface.

11. The method as defined in claim 6 wherein the metal is rendered mobile by subjecting the at least one of the cermet film and the ceramic film to reduction.

12. The method as defined in claim 11 wherein the metal is nickel and the ceramic is samarium doped cerium, and wherein the causing step is accomplished by annealing.

13. The method as defined in claim 12 wherein nickel is rendered mobile by reduction.

14. The method as defined in claim 12 wherein the nickel is co-deposited in the presence of 5% oxygen.

15. The method as defined in claim 14 wherein annealing results in a porous ceramic film having an amount of nickel agglomerated on a surface thereof, and an amount of nickel oxide remaining in the porous ceramic film, and wherein the method further comprises the step of subjecting the porous ceramic film having nickel oxide therein to reduction in the presence of hydrogen to render a porous cermet film.

16. The method as defined in claim 15 wherein the amount of nickel agglomerated on the ceramic film surface is between about 0% and about 50% of the nickel co-deposited on the substrate.

17. The method as defined in claim 15 wherein the reduction takes place at a temperature of between about 400° C. and 800° C.

18. The method as defined in claim 11 wherein the metal is platinum and the ceramic is samarium doped cerium, and wherein the causing step is accomplished by sintering.

19. The method as defined in claim 18 wherein the platinum is rendered mobile by reduction, and wherein the sintering causes a first amount of platinum which remains in the ceramic film to reduce, thereby rendering a porous cermet film, and wherein the sintering causes a second amount of platinum to agglomerate on the porous cermet film surface.

20. The method as defined in claim 19 wherein oxidation takes place in the presence of 5% oxygen.

21. The method as defined in claim 6 wherein annealing takes place at a temperature ranging form 344°C. and 590°C.

22. The method as defined in claim 1 wherein the metal is at least one of gold, nickel, cooper, silver, alloys thereof, and mixtures thereof.

23. A method for making a porous film, comprising the steps of:
co-depositing a metal and a ceramic on a substrate, thereby forming at least one of a cermet film and a ceramic film; and
subjecting the at least one of the cermet film and the ceramic film to conditions such that the metal therein reduces, wherein at least a portion of the metal diffuses to a surface of the at least one of the cermet film and the ceramic film, thereby forming at least one of a porous ceramic film and a porous cermet film.

24. The method as defined in claim 23 wherein the metal is at least one of gold, nickel, platinum, copper, palladium, silver, rhodium, ruthenium, alloys thereof, and mixtures thereof.

25. The method as defined in claim 23 wherein the ceramic is at least one of nickel oxides, platinum oxides, Ni—YSZ, Cu—YSZ, Ni—SDC, Ni-GDC, Cu—SDC, Cu-GDC, silver oxides, samarium strontium cobalt oxide (SSCO, $Sm_xSr_yCoO_{3-\delta}$), barium lanthanum cobalt oxide (BLCO, $Ba_xLa_yCoO_{3-\delta}$), gadolinium strontium cobalt oxide (GSCO, $Gd_xSr_yCoO_{3-\delta}$), lanthanum strontium manganite ($La_xSr_yMnO_{3-\delta}$), lanthanum strontium cobalt ferrite ($La_wSr_xCo_yFe_zO_{3-\delta}$), and mixtures thereof.

26. The method as defined in claim 23 wherein the co-depositing of the metal and the ceramic is accomplished by at least one of physical vapor deposition, chemical vapor deposition, atomic layer deposition, and angle deposition.

27. The method as defined in claim 23 wherein the co-depositing step takes place in the presence of oxygen.

28. The method as defined in claim 23 wherein the metal is platinum.

29. The method as defined in claim 28 wherein the subjecting step is accomplished by sintering, wherein sintering causes a first amount of the platinum which remains in the ceramic film to reduce, thereby rendering a porous cermet film, and wherein the sintering causes a second amount of platinum to agglomerate on the porous cermet film surface.

30. The method as defined in claim 29 wherein sintering takes place at a temperature ranging between about 750° C. and about 1000° C.

31. The method as defined in claim 23 wherein the metal is nickel.

32. The method as defined in claim 31 wherein the subjecting step comprises the steps of:
   subjecting the ceramic film to annealing, the ceramic film having nickel oxide therein; and
   subjecting the ceramic film having nickel oxide therein to reduction in the presence of hydrogen.

33. The method as defined in claim 32 wherein the reduction takes place at a temperature between about 400° C. and about 800° C.

34. A method for making a porous film, comprising the steps of:
   co-depositing a highly mobile metal and a ceramic on a substrate, thereby forming a cermet film; and
   subjecting the cermet film to annealing, wherein the highly mobile metal diffuses to and agglomerates on the cermet film surface, thereby forming a porous ceramic film.

35. The method as defined in claim 32 wherein the highly mobile metal is gold.

36. A method for making a porous film, comprising the step of:
   forming the porous film by at least one of reducing a metal within at least one of a cermet film and a ceramic film, and causing the metal to diffuse to at least one of a surface of the cermet film and a surface of the ceramic film, the at least one of the cermet film and the ceramic film having been formed by depositing at least one metal-containing material on a substrate.

37. The method as defined in claim 36 wherein the at least one metal containing material is at least one of metals, metal oxides, ceramics, cermets, binary ceramics.

38. The method as defined in claim 36 wherein at least two of the metal-containing materials are co-deposited on the substrate.

* * * * *

UNITED STATES PATENT AND TRADEMARK OFFICE
CERTIFICATE OF CORRECTION

PATENT NO. : 7,445,814 B2  Page 1 of 1
APPLICATION NO. : 10/691199
DATED : November 4, 2008
INVENTOR(S) : Peter Mardilovich et al.

It is certified that error appears in the above-identified patent and that said Letters Patent is hereby corrected as shown below:

In column 9, line 51, in Claim 5, delete "GDG" and insert -- GDC --, therefor.

In column 10, line 38, in Claim 21, delete "form" and insert -- from --, therefor.

In column 10, line 40, in Claim 22, delete "cooper" and insert -- copper --, therefor.

In column 12, line 8, in Claim 35, delete "claim 32" and insert -- claim 34 --, therefor.

In column 12, line 18, in Claim 36, after "substrate" insert -- , wherein the at least one metal-containing material contains the metal --.

Signed and Sealed this

Twenty-fourth Day of March, 2009

JOHN DOLL
*Acting Director of the United States Patent and Trademark Office*